US011336250B2

(12) United States Patent
Ou et al.

(10) Patent No.: US 11,336,250 B2
(45) Date of Patent: May 17, 2022

(54) METHOD FOR PREPARING FILM BULK ACOUSTIC WAVE DEVICE BY USING FILM TRANSFER TECHNOLOGY

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xin Ou, Shanghai (CN); Kai Huang, Shanghai (CN); Qi Jia, Shanghai (CN); Shibin Zhang, Shanghai (CN); Tiangui You, Shanghai (CN); Xi Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 237 days.

(21) Appl. No.: 17/279,847

(22) PCT Filed: Jul. 10, 2017

(86) PCT No.: PCT/CN2017/092396
§ 371 (c)(1),
(2) Date: Mar. 25, 2021

(87) PCT Pub. No.: WO2018/006883
PCT Pub. Date: Jan. 11, 2018

(65) Prior Publication Data
US 2022/0038070 A1 Feb. 3, 2022

(30) Foreign Application Priority Data
Jul. 6, 2016 (CN) .......................... 201610527875.6

(51) Int. Cl.
*H03H 3/02* (2006.01)
*H03H 9/17* (2006.01)

(52) U.S. Cl.
CPC .............. *H03H 3/02* (2013.01); *H03H 9/174* (2013.01); *H03H 2003/023* (2013.01); *Y10T 29/42* (2015.01)

(58) Field of Classification Search
CPC .... H03H 3/02; H03H 9/174; H03H 2003/023; Y10T 29/42
See application file for complete search history.

(56) References Cited

U.S. PATENT DOCUMENTS

2003/0076007 A1* 4/2003 Murai .................... B41J 2/1628
310/324
2003/0199105 A1* 10/2003 Kub ........................ H01L 27/20
438/3

(Continued)

FOREIGN PATENT DOCUMENTS

CN 101038865 A 9/2007
CN 104038177 A 9/2014
(Continued)

*Primary Examiner* — Jeffrey T Carley
(74) *Attorney, Agent, or Firm* — Global IP Services; Tianhua Gu

(57) ABSTRACT

A method for preparing a film bulk acoustic wave device by using a film transfer technology includes: 1) providing an oxide monocrystal substrate; 2) implanting ions from the implantation surface into the oxide monocrystal substrate, and then forming a lower electrode on the implantation surface; or vice versa; and forming a defect layer at the preset depth; 3) providing a support substrate and bonding a structure obtained in step 2) with the support substrate; 4) removing part of the oxide monocrystal substrate along the defect layer so as to obtain an oxide monocrystal film, and transferring the obtained oxide monocrystal film and the lower electrode to the support substrate; 5) etching the (Continued)

support substrate from a bottom of the support substrate to form a cavity; 6) forming an upper electrode on the surface of the oxide monocrystal film.

13 Claims, 8 Drawing Sheets

(56) References Cited

U.S. PATENT DOCUMENTS

| | | | | |
|---|---|---|---|---|
| 2005/0104939 A1* | 5/2005 | Wada | ................. | B41J 2/1632 |
| | | | | 347/68 |
| 2006/0001508 A1* | 1/2006 | Ohara | ................. | H03H 9/173 |
| | | | | 333/191 |
| 2012/0273904 A1 | 11/2012 | Defay et al. | | |

FOREIGN PATENT DOCUMENTS

| | | | | |
|---|---|---|---|---|
| CN | 105308860 A | 2/2016 | | |
| CN | 106209003 A | 12/2016 | | |
| EP | 1489740 A2 * | 12/2004 | ............. | H03H 9/564 |

* cited by examiner

METHOD FOR PREPARING FILM BULK ACOUSTIC WAVE DEVICE BY USING FILM TRANSFER TECHNOLOGY

CROSS REFERENCE TO RELATED PATENT APPLICATION

The present application is the US national stage of PCT/CN2017/092396 filed on Jul. 10, 2017, which claims the priority of the Chinese patent application No. 201610527875.6 filed on Jul. 6, 2016, which application is incorporated herein by reference.

TECHNICAL FIELD

The present disclosure belongs to the technical field of semiconductor preparation, and particularly relates to a method for preparing a film bulk acoustic wave device by using a film transfer technology.

BACKGROUND

With the development of science and technology, film bulk acoustic wave devices have been widely used. The conventional methods for preparing a film bulk acoustic wave device generally include depositing an oxide dielectric film on a metal bottom electrode, and then preparing a metal top electrode on the oxide film to form a metal-oxide-metal sandwich structure. The key is the preparation of the oxide dielectric film. Common methods for preparing the oxide dielectric film include a pulse laser deposition method, a magnetron sputtering method, an atomic layer deposition method, a thermal evaporation method, and the like. However, these traditional film preparation methods have many problems. For example, the oxide film generally needs to be grown at a higher temperature, which is difficult to be compatible with the existing CMOS process. In addition, due to the influence of is factors such as lattice mismatch, thermal mismatch and interface defects, these traditional film preparation methods are unable to grow a high-quality monocrystal oxide film on a polycrystal metal bottom electrode. However, the non-crystal or polycrystal films prepared by traditional film preparation methods have some problems. On the one hand, there are many different defects in both the non-crystal or polycrystal films; and on the other hand, the distribution of defects in the non-crystal or polycrystal films is random, which is a bottleneck difficult to break through in reduction of the device size, stabilization and optimization of device parameters and reliability research. Therefore, the key to promote the development of the film bulk acoustic wave device is how to efficiently prepare a high-quality monocrystal oxide film on a metal substrate.

SUMMARY

The present disclosure provides a method for preparing a film bulk acoustic wave device by using a film transfer technology, which is used to solve the problems existing in traditional film preparation methods for preparing film bulk acoustic wave devices.

The present disclosure provides a method for preparing a film bulk acoustic wave device by using a film transfer technology, which includes at least the following steps: 1) providing an oxide monocrystal substrate, one surface of the oxide monocrystal substrate is an implantation surface; 2) implanting ions from the implantation surface into the oxide monocrystal substrate, and then forming a lower electrode on the implantation surface; or forming the lower electrode on the implantation surface, and then implanting ions from the implantation surface into the oxide monocrystal substrate, wherein ion implantation energy is sufficient to implant ions into a preset depth in the oxide monocrystal substrate; and forming a defect layer at the preset depth; 3) providing a support substrate and bonding a structure obtained in step 2) with the support substrate, wherein the surface of the lower electrode is a bonding surface; 4) removing part of the oxide monocrystal substrate along the defect layer so as to obtain an oxide monocrystal film, and transferring the obtained oxide monocrystal film and the lower electrode to the support substrate; 5) etching the support substrate from a bottom of the support substrate to form a cavity, wherein the cavity exposes the lower electrode; and 6) forming an upper electrode on the surface of the oxide monocrystal film.

As a preferred solution of the method for preparing a film bulk acoustic wave device by using a film transfer technology, between step 1) and the step 2), the method further comprises a step of cleaning the oxide monocrystal substrate.

As a preferred solution of the method for preparing a film bulk acoustic wave device by using a film transfer technology, in the step 2), the ions implanted into the oxide monocrystal substrate are H ions or He ions.

As a preferred solution of the method for preparing a film bulk acoustic wave device by using a film transfer technology, an implantation dose of the H ions or He ions is $1\times10^{16}$ ions/cm$^2$ to $1\times10^{18}$ ions/cm$^2$.

As a preferred solution of the method for preparing a film bulk acoustic wave device by using a film transfer technology, in the step 2), the ions implanted into the oxide monocrystal substrate are H ions and He ions.

As a preferred solution of the method for preparing a film bulk acoustic wave device by using a film transfer technology, the H ions is implanted before the He ions. As a preferred solution of the method for preparing a film bulk acoustic wave device by using a film transfer technology, the H ions is implanted after the He ions.

As a preferred solution of the method for preparing a film bulk acoustic wave device by using a film transfer technology, the H ions and the He ions are simultaneously implanted.

As a preferred solution of the method for preparing a film bulk acoustic wave device by using a film transfer technology, the implantation doses of the H ions and the He ions are both $1\times10^{18}$ ions/cm$^2$ to $1\times10^{18}$ ions/cm$^2$.

As a preferred solution of the method for preparing a film bulk acoustic wave device by using a film transfer technology, in the step 2), the preset depth is 10 nm to 50 μm.

As a preferred solution of the method for preparing a film bulk acoustic wave device by using a film transfer technology, in step 3), the structure obtained in the step 2) is bonded with the support substrate by a direct bonding process or an indirect bonding process such as a dielectric layer bonding process, a metal bonding process or an anode bonding process.

As a preferred solution of the method for preparing a film bulk acoustic wave device by using a film transfer technology, in step 4), the structure obtained in the step 3) is annealed to remove part of the oxide monocrystal substrate along the defect layer.

As a preferred solution of the method for preparing a film bulk acoustic wave device by using a film transfer technology, the annealing treatment is performed in a vacuum environment or in a protective atmosphere formed by at least one of nitrogen gas, oxygen gas and inert gases, the annealing temperature is 100° C. to 600° C., and the annealing time is 1 min to 48 h.

As a preferred solution of the method for preparing a film bulk acoustic wave device by using a film transfer technology, between step 4) and step 5), the method further comprises a step of performing surface flattening treatment on the oxide monocrystal film.

The method for preparing a film bulk acoustic wave device by using a film transfer technology consistent with the present disclosure has the following beneficial effects: effectively solves the problem of preparing the monocrystal oxide between the metal electrodes.

DESCRIPTION OF REFERENCE NUMERALS

Figure 1:
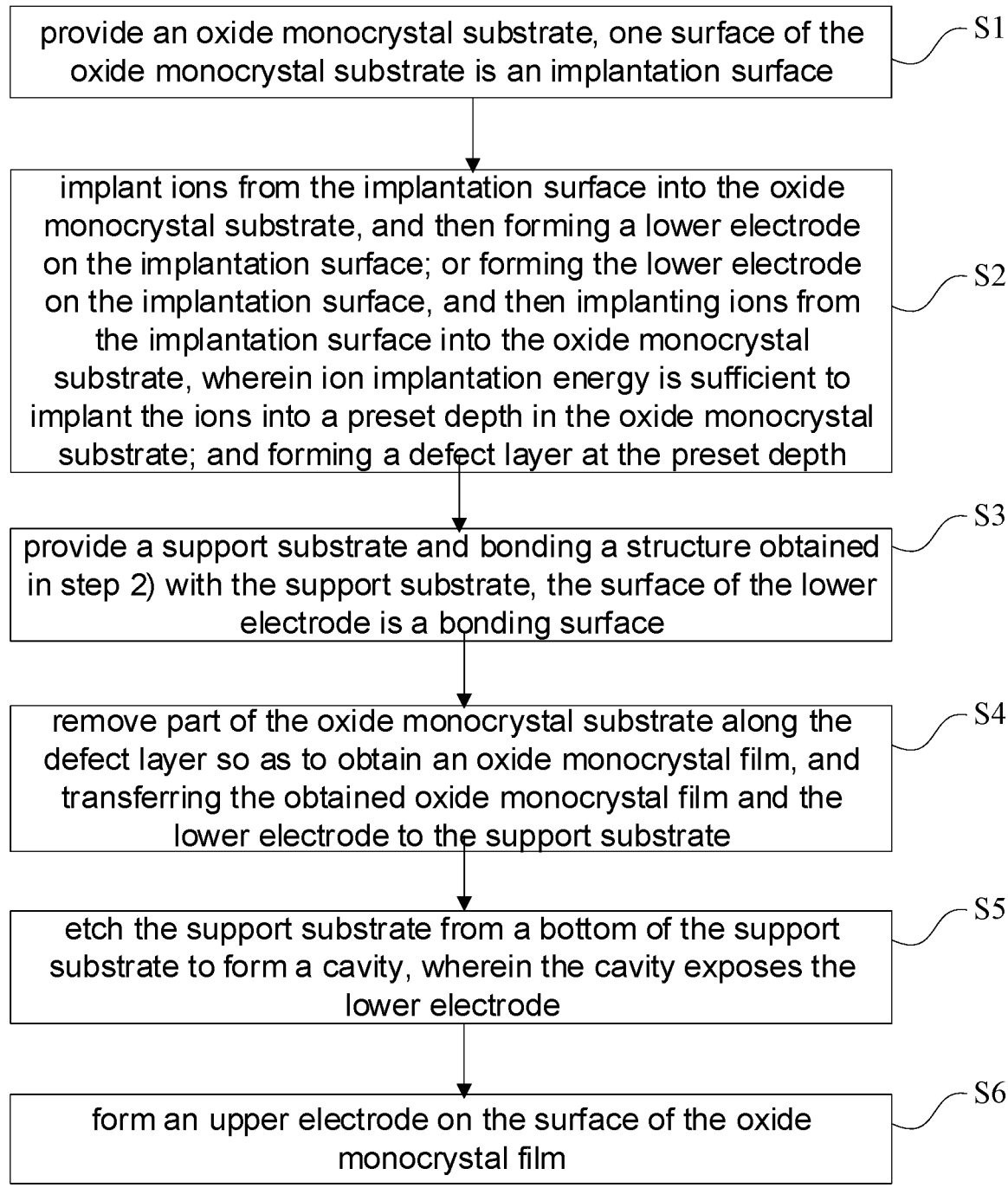
FIG. 1 shows a flow diagram of a method for preparing a film bulk acoustic wave device by using a film transfer technology according to the present disclosure.

1 Oxide monocrystal substrate
11 Implantation surface
12 Defect layer
13 Bonded dielectric layer
14 Oxide monocrystal film
2 Lower electrode
3 Support substrate
4 Upper electrode layer
41 Upper electrode
5 Cavity

DETAILED DESCRIPTION OF THE PREFERRED EMBODIMENTS

The implementations of the disclosure are described below through specific examples. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Reference is made to FIGS. 1 to 16. It should be noted that, the drawings provided in the present embodiment only exemplify the basic idea of the present disclosure. Although only the components related to the present disclosure are shown in the drawings, and are not drawn according to the quantities, shapes, and sizes of the components during actual implementation, during actual implementation, the patterns, quantities, and proportions of the components may be randomly changed, and the layout pattern of the components may be more complicated.

Please referring to FIG. 1, the present disclosure provides a method for preparing a film bulk acoustic wave device by using a film transfer technology. The method at least includes the following steps:

S1: providing an oxide monocrystal substrate. One surface of the oxide monocrystal substrate is an implantation surface.

S2: implanting ions from the implantation surface into the oxide monocrystal substrate, and then forming a lower electrode on the implantation surface; or forming the lower electrode on the implantation surface, and then implanting ions from the implantation surface into the oxide monocrystal substrate. The energy for ion implantation is sufficient to implant the ions into a preset depth in the oxide monocrystal substrate. A defect layer is formed at the preset depth.

S3: providing a support substrate, and the bonding the structure obtained in step 2) with the support substrate. The surface of the lower electrode is a bonding surface.

S4: removing part of the oxide monocrystal substrate along the defect layer so as to obtain an oxide monocrystal film, and the obtained oxide monocrystal film and the lower electrode are transferred to the support substrate.

S5: etching the support substrate from a bottom of the support substrate to form a cavity. The cavity exposes the lower electrode out.

S6: forming an upper electrode on the surface of the oxide monocrystal film.

Figure 2:
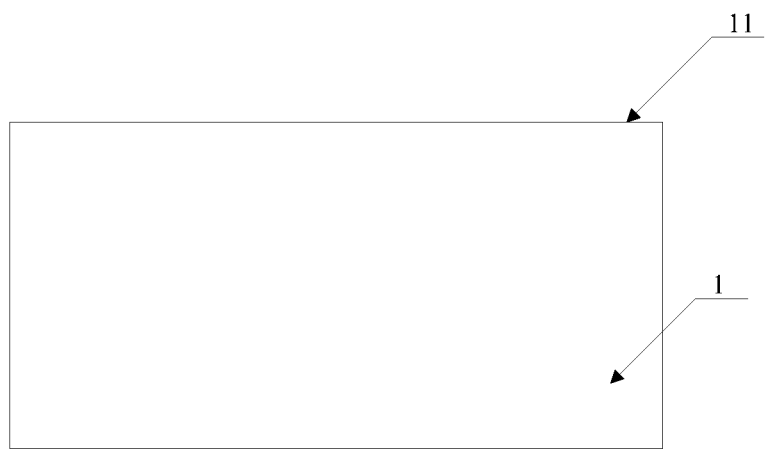
FIGS. 2 to 16 show schematic diagrams corresponding to each step in the method for preparing a film bulk acoustic wave device by using a film transfer technology according to the present disclosure.

For the execution of S1, please refer to S1 in FIG. 1 and FIG. 2. An oxide monocrystal substrate 1 is provided. One surface of the oxide monocrystal substrate 1 is an implantation surface 11.

As an example, the oxide monocrystal substrate 1 may be, but is not limited to, a lithium niobate substrate or a lithium tantalate substrate.

As an example, after the oxide monocrystal substrate 1 is provided, the oxide monocrystal substrate 1 is cleaned. The method for cleaning the oxide monocrystal substrate 1 may be a substrate cleaning method commonly used in the semiconductor field, which is not limited. By cleaning the oxide substrate 1, impurities on the surface of the oxide substrate 1 can be cleared so as to improve the quality of a lower electrode formed on the surface of the oxide monocrystal substrate 1 subsequently.

For the execution of S2, please refer to S2 in FIG. 1 and FIGS. 3 to 6. Ions are implanted from the implantation surface 11 into the oxide monocrystal substrate 1, and then a lower electrode 2 is formed on the implantation surface 11; or the lower electrode 2 is formed on the implantation surface 11, and then ions are implanted from the implantation surface 11 into the oxide monocrystal substrate 1. The energy for ion implantation is sufficient to implant ions into a preset depth in the oxide monocrystal substrate 1. A defect layer 12 is formed at the preset depth.

Figure 3:
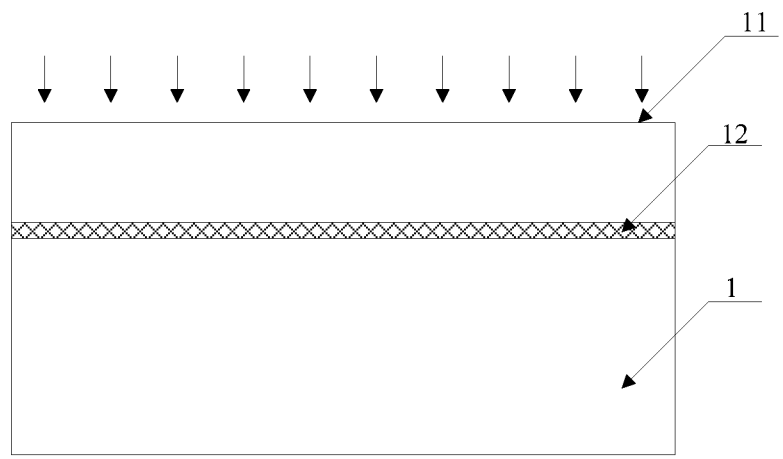
Figure 4:
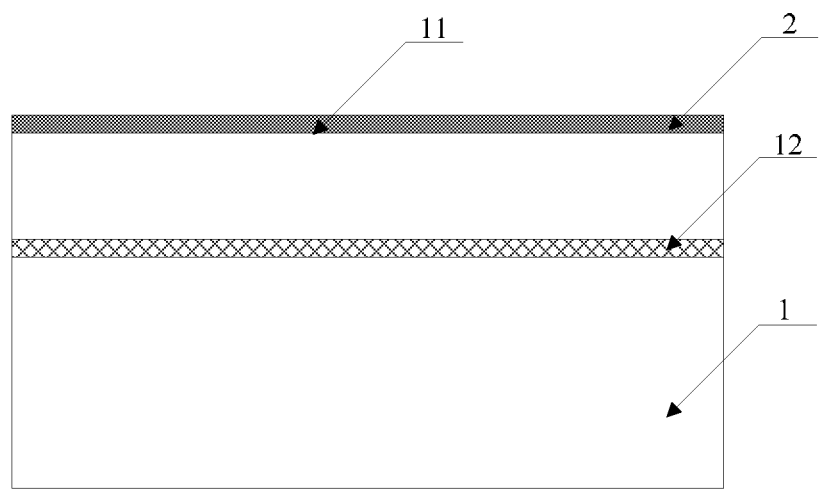

In an example, firstly ions are implanted from the implantation surface 11 into the oxide monocrystal substrate 1, as shown in FIG. 3, and then the lower electrode 2 is formed on the implantation surface 11, as shown in FIG. 4.

Figure 5:
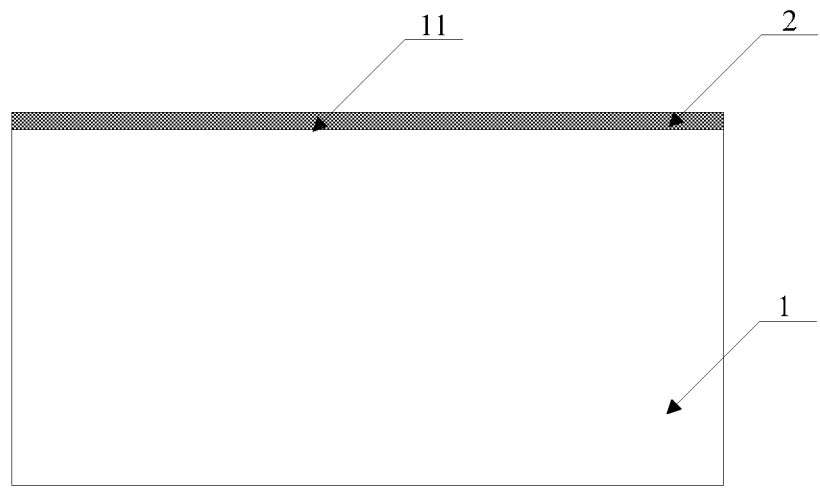

In another example, firstly the lower electrode 2 is formed on the implantation surface 11, as shown in FIG. 5, and then ions are implanted from the implantation surface 11 into the oxide monocrystal substrate 1.

As an example, the preset depth may be, but is not limited to, 10 nm to 50 μm, that is, a distance between the defect layer 12 formed by ion implantation and the implantation surface 11 may be, but is not limited to, 10 nm to 50 μm.

As an example, the thickness of the lower electrode 2 may be set according to actual needs. Preferably, in the present embodiment, the thickness of the lower electrode 2 is 10 nm to 2 μm.

As an example, the lower electrode 2 may be a single metal film or a stacked structure of different metal film layers. Preferably, in the present embodiment, the material of the lower electrode 2 may be, but is not limited to, copper, gold, titanium, platinum, molybdenum, ruthenium, chromium, aluminum or tin.

In an embodiment, ions of a single type are implanted into the oxide monocrystal substrate 1, and the implanted ions are H ions. The H ions can destroy the crystal lattice at the peeling depth (that is, at the defect layer 12), so that part of the oxide monocrystal substrate 1 can be removed.

Since the depth of forming the defect layer 12 is determined by the ion implantation energy and the defect density required for separation is determined by an ion implantation dose, therefore, suitable ion implantation dose and ion implantation energy should be selected. Furthermore, the depth of the formed defect layer 12 directly determines the thickness of a finally obtained thick film. In the present embodiment, the implantation dose of the H ions is $1\times10^{16}$ ions/cm$^2$ to $1\times10^{18}$ ions/cm$^2$.

In another embodiment, similarly, ions of a single type are implanted into the oxide monocrystal substrate 1. However, in the present embodiment, the implanted ions are He ions. After the He ions are implanted into the oxide monocrystal substrate, defects will be generated in the oxide monocrystal substrate, the He ions will screw into the defects and generate pressure, and the defects are in Gaussian distribution in the defect layer 12. In subsequent treatment processes, part of the oxide monocrystal substrate may be removed from the place with the maximum defect concentration.

As an example, the implantation dose of the He ions is $1\times10^{16}$ ions/cm$^2$ to $1\times10^{18}$ ions/cm$^2$.

In another embodiment, co-implantation of the two types of ions is performed in the oxide monocrystal substrate 1, and the implanted ions are H ions and He ions. The H ions are used to form defects as mentioned above, and the defects are in Gaussian distribution in the defect layer 12; and He is an inert element and has no chemical action with the oxide monocrystal substrate, but may be captured by platform defects formed by the H ions, and these platform defects may be enlarged and combined with each other through physical action to finally form cracks that can separate the oxide monocrystal substrate, thereby facilitating the removal of part of the oxide monocrystal substrate from the place with the maximum defect concentration. Co-implantation of the H ions and the He ions is performed in the oxide monocrystal substrate 1, and the He ions may be captured by the defects formed by the H ions so as to enter atomic gaps and apply pressure, which is equivalent to applying an extra acting force inside the defects generated by the H ions, so as to effectively facilitate the removal of the oxide monocrystal substrate 1 under the condition that the ion implantation dose is lower, namely effectively reduce the total ion implantation dose, thereby shortening the preparation period and saving the production cost.

Figure 6:
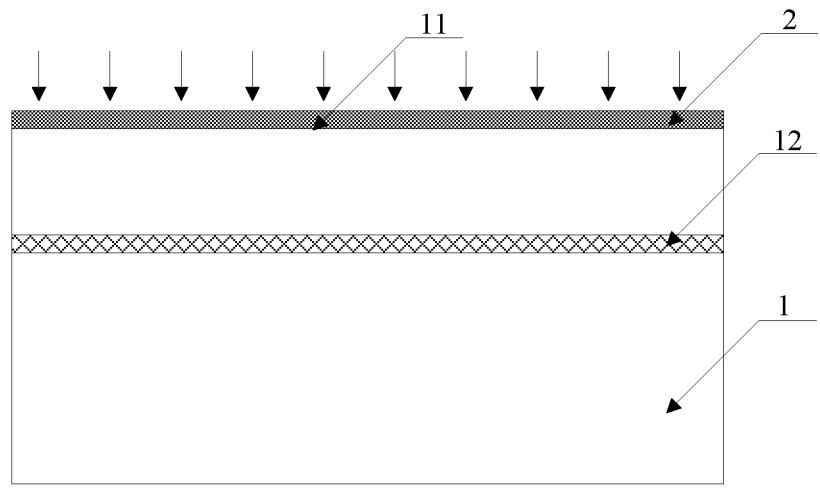

As an example, the co-implantation of the H ions and the He ions may be performed sequentially or simultaneously. That is, the implantation of the H ions may be performed before the implantation of the He ions, or may be performed after the implantation of the He ions, or may also be performed simultaneously with the implantation of the He ions. The arrows perpendicular to the implantation surface 11 of the oxide monocrystal substrate 1 shown in FIG. 3 and FIG. 6 represent ion implantation directions.

As an example, the implantation doses of the H ions and the He ions are both in the range of $1\times10^{16}$ ions/cm$^2$ to $1\times10^{18}$ ions/cm$^2$.

It should be noted that in order to make the implanted He ions easily captured by the defects formed by the H ions, the implantation depth of the He ions needs to be the same as or similar to the implantation depth of the H ions, that is, it is necessary to ensure that the range ($R_p$) of the He ions is near the implantation range of the H ions.

Figure 7:
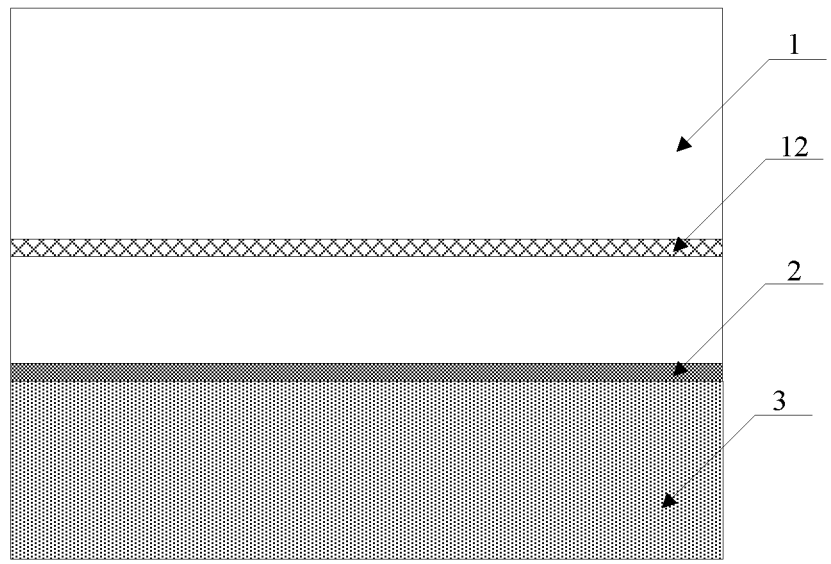
Figure 8:
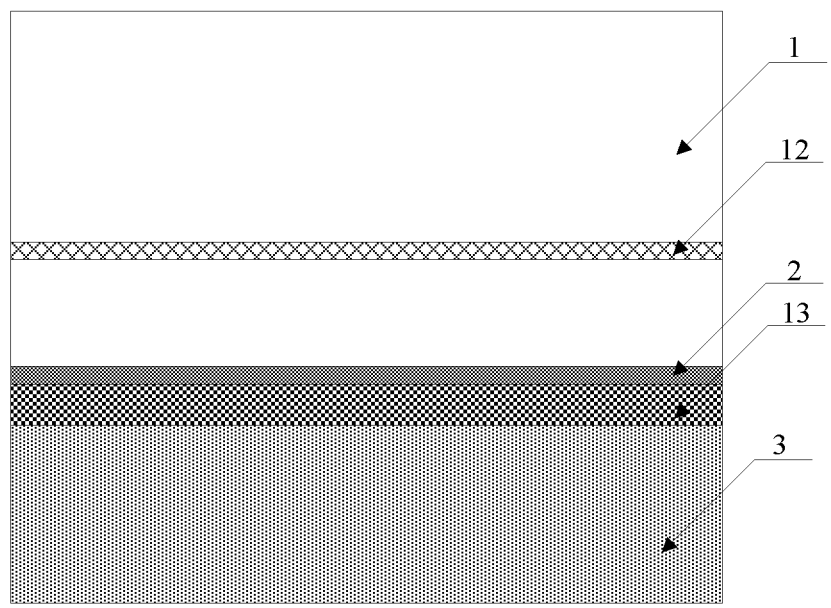

For the execution of S3, please refer to S3 in FIG. 1 and FIGS. 7 to 8. A support substrate 3 is provided, a structure obtained in step 2) is bonded with the support substrate 3, and the surface of the lower electrode 2 is a bonding surface.

As an example, the support substrate 3 may be a substrate having the same material as the oxide monocrystal substrate 1, or may be other heterogeneous substrates such as silicon, sapphire, silicon carbide, diamond, gallium nitride, gallium arsenide or glass.

In an example, as shown in FIG. 7, the structure obtained in the step 2) may be bonded with the support substrate 3 by a direct bonding process. At this time, the lower electrode 2 is in contact with the support substrate 3.

In another example, as shown in FIG. 8, the structure obtained in the step 2) may be bonded with the support substrate 3 by an indirect bonding process such as a dielectric layer bonding process, a metal bonding process or an anode bonding process. The dielectric layer bonding process includes a growth dielectric layer bonding process, a polymer bonding process, a molten glass bonding process and a spin-on glass bonding process. At this time, the lower electrode 2 and the support substrate 3 are bonded together through a bonded dielectric layer 13.

Figure 9:
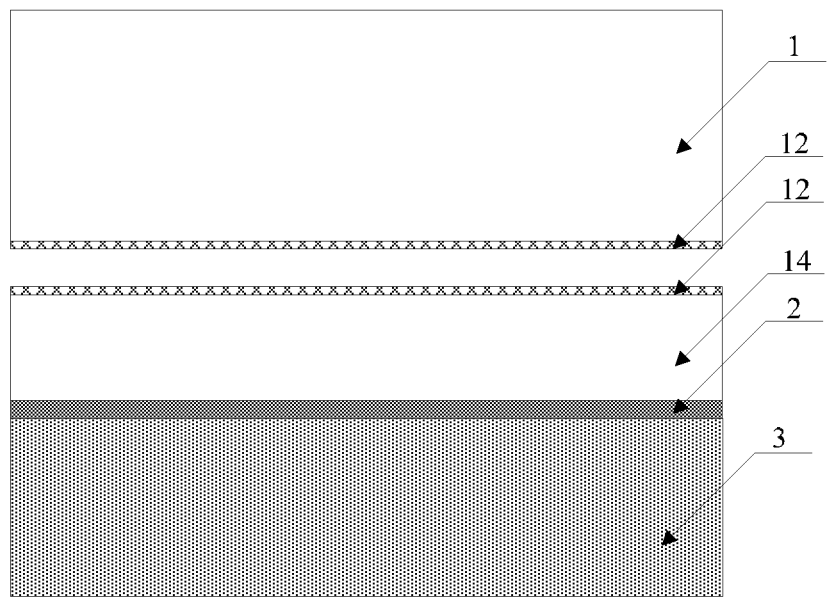
Figure 10:
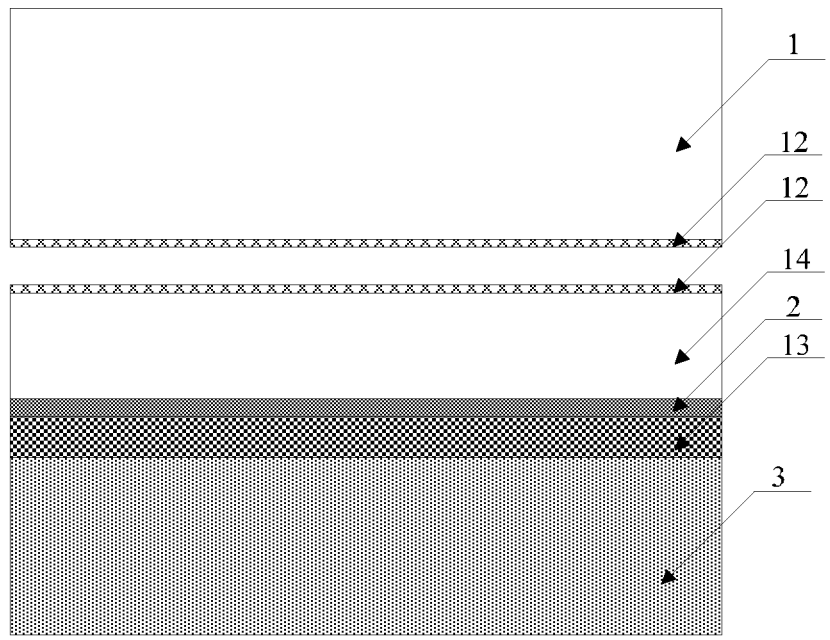

For the execution of S4, please refer to S4 in FIG. 1 and FIGS. 9 to 10. Part of the oxide monocrystal substrate 1 is removed along the defect layer 12 so as to obtain an oxide monocrystal film 14, and the obtained oxide monocrystal film 14 and the lower electrode 2 are transferred to the support substrate 3.

It should be noted that FIG. 9 is a structure, corresponding to FIG. 7, obtained by the following manner: after the structure obtained in the step 2) is bonded with the support substrate 3 by a direct bonding process, part of the oxide monocrystal substrate 1 is removed along the defect layer 12 so as to obtain the oxide monocrystal film 14. The obtained oxide monocrystal film 14 and the lower electrode 2 are transferred to the support substrate 3. FIG. 10 is a structure, corresponding FIG. 8, obtained by the following manner: after the structure obtained in the step 2) is bonded with the support substrate 3 by an indirect bonding process such as a dielectric layer bonding process, a metal bonding process or an anode bonding process, part of the oxide monocrystal substrate 1 is removed along the defect layer 12 so as to obtain the oxide monocrystal film 14, and the obtained oxide monocrystal film 14 and the lower electrode 2 are transferred to the support substrate 3.

In an embodiment, a method for removing part of the oxide monocrystal substrate 1 along the defect layer 12 includes: the oxide monocrystal substrate 1 with the defect layer 12 is subjected to annealing treatment so as to remove part of the oxide monocrystal substrate 1 along the defect layer 12. Specifically, the annealing process is performed in a vacuum environment or in a protective atmosphere formed by at least one of nitrogen gas and inert gases, the annealing temperature is 100° C. to 600° C., and the annealing time is 1 min to 48 h. During annealing at 100° C. to 600° C., the implanted ions (that is, H ions and He ions) will be thermally expanded to increase the pressure applied to atoms, thereby facilitating the removal of the oxide monocrystal substrate 1 from the place with the maximum defect concentration.

In another embodiment, a specific method for removing part of the oxide monocrystal substrate 1 along the defect layer 12 is: firstly, the oxide monocrystal substrate 1 with the defect layer 12 is subjected to annealing treatment, the annealing process is performed in a vacuum environment or in a protective atmosphere formed by at least one of nitrogen gas and inert gases, the annealing temperature is 100° C. to 600° C., and the annealing time is 1 min to 48 h. Secondly, after the annealing treatment, a transverse mechanical force is applied to the defect layer 12 so as to remove part of the oxide monocrystal substrate 1 along the defect layer 12. Since whether the oxide monocrystal substrate 1 can form the defect density required for separation is determined by the ion implantation dose, if the oxide monocrystal substrate 1 is separated from the defect layer 12 only by annealing, a specific dose of ions need to be implanted into the oxide monocrystal substrate 1. If applying the transverse mechanical force to the defect layer 12, even if the dose of the implanted ions in the oxide monocrystal substrate 1 is relatively small and the defect density required for separation is not formed, under the action of an external force, the oxide monocrystal substrate 1 can also be separated from the defect layer 12, that is, the total ion implantation dose can be reduced by applying the transverse mechanical force to the defect layer 12, so as to facilitate the removal of the oxide monocrystal substrate 1 from the defect layer 12, thereby shortening the preparation period and saving the production cost.

In another embodiment, a specific method for removing part of the oxide monocrystal substrate 1 along the defect layer 12 is: firstly, the oxide monocrystal substrate 1 with the defect layer 12 is subjected to annealing treatment, the annealing process is performed in a vacuum environment or in a protective atmosphere formed by at least one of nitrogen gas and inert gases, the annealing temperature is 100° C. to 600° C., and the annealing time is 1 min to 48 h. Secondly, after the annealing treatment, the annealing temperature is maintained, and an auxiliary material layer is deposited on the implantation surface 11 of the oxide monocrystal substrate 1 and then quickly cooled. The auxiliary material layer and the oxide monocrystal substrate 1 have different thermal expansion coefficients.

As an example, the auxiliary material may be any substance having a thermal expansion coefficient different from that of the oxide monocrystal substrate 1. Preferably, in the present embodiment, the auxiliary material is a high polymer. Since the auxiliary material and the oxide monocrystal substrate 1 have different thermal expansion coefficients, particularly when the difference between the thermal expansion coefficients of the auxiliary material and the oxide monocrystal substrate is larger, during quick cooling, thermal stress will be generated in the structure consisting of the auxiliary material and the oxide monocrystal substrate, and the thermal stress will cause the oxide monocrystal substrate 1 to be removed from the place with the maximum implantation defect concentration. The manner of quick cooling may be, but is not limited to, furnace cooling.

Since whether the oxide monocrystal substrate 1 can have the defect density required for separation is determined by the ion implantation dose, if the oxide monocrystal substrate 1 is separated from the defect layer 12 only by annealing, a specific dose of ions need to be implanted into the oxide monocrystal substrate 1; if by depositing and then quickly cooling the auxiliary material layer on the implantation surface of the oxide monocrystal substrate 1 so as to generate thermal stress in the structure formed by the two, even if the dose of the implanted ions in the oxide monocrystal substrate 1 is relatively small and the defect density required for separation is not formed, under the action of the thermal stress, the oxide monocrystal substrate 1 can also be separated from the defect layer 12, that is, the total ion implantation dose can be reduced by depositing and quickly cooling the auxiliary material layer on the implantation surface of the oxide monocrystal substrate 1, so as to facilitate the removal of the oxide monocrystal substrate 1 from the defect layer 12, thereby shortening the preparation period and saving the production cost.

As an example, after the execution of S4, the method further comprises a step of injecting inert gases into the oxide monocrystal film 14. By injecting inert gases into the oxide monocrystal film 14, stress and defects may be introduced into the oxide monocrystal film 14 so as to adjust and control the resistance characteristic of the oxide monocrystal film 14.

As an example, after the execution of S4, the method further includes a step of performing surface flattening treatment on the oxide monocrystal film 14, so as to ensure the quality of the subsequently formed upper electrode.

Figure 11:
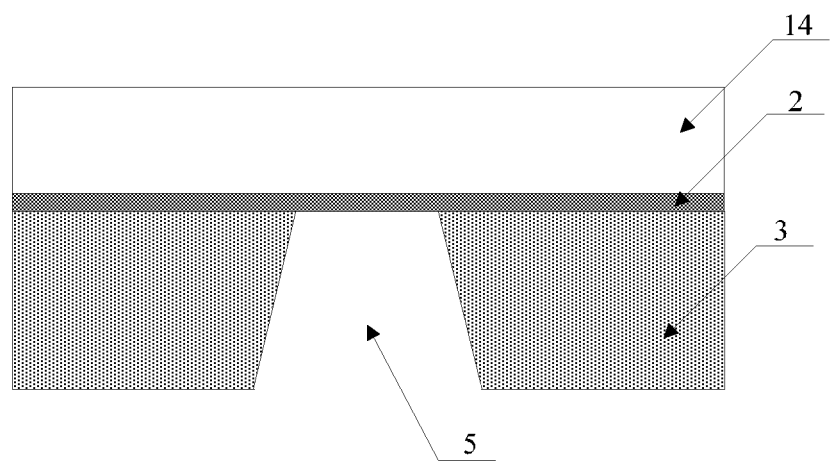
Figure 12:
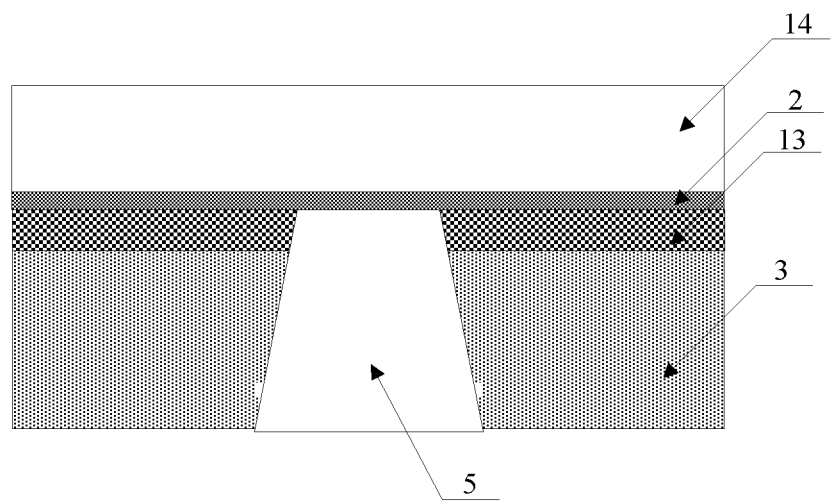

For the execution of S5, please refer to S5 in FIG. 1 and FIGS. 11 to 12. The support substrate 3 is etched from a bottom of the support substrate 3 to form a cavity 5. The cavity 5 exposes the lower electrode 2 out.

As an example, as shown in FIG. 11, corresponding to the structure obtained in FIG. 9, the oxide monocrystal film 14 and the lower electrode 2 are bonded on the surface of the support substrate 3 by a direct bonding process, the support substrate 3 may be etched from the bottom of the support substrate 3 by photolithography and etching processes to form the cavity 5 in the support substrate 3, and the cavity 5 penetrates through the support substrate 3 so as to ensure that the cavity 5 can expose the lower electrode 2 on the front surface of the support substrate 3.

As an example, as shown in FIG. 12, corresponding to the structure obtained in FIG. 10, the oxide monocrystal film 14 and the lower electrode 2 are bonded on the surface of the support substrate 3 by an indirect bonding process such as a dielectric layer bonding process, a metal bonding process or an anode bonding process. The support substrate 3 and the bonded dielectric layer 13 may be etched from the bottom of the support substrate 3 by photolithography and etching processes to form the cavity 5 in the support substrate 3 and the bonded dielectric layer 13. The cavity 5 penetrates through the support substrate 3 and the bonded dielectric layer 13 so as to ensure that the cavity 5 can expose the lower electrode 2 on the front surface of the support substrate 3.

As an example, the shape of the cavity 5 may be set according to actual needs. Preferably, in the present embodiment, the shape of the cross section of the cavity 5 is trapezoid.

For the execution of S6, please refer to S6 in FIG. 1 and FIGS. 13 to 16. An upper electrode 41 is formed on the surface of the oxide monocrystal film 14.

Figure 13:
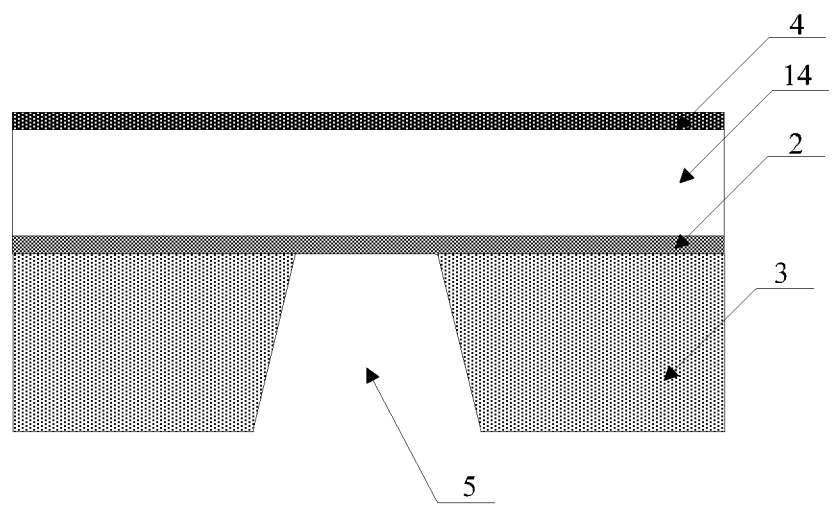
Figure 14:
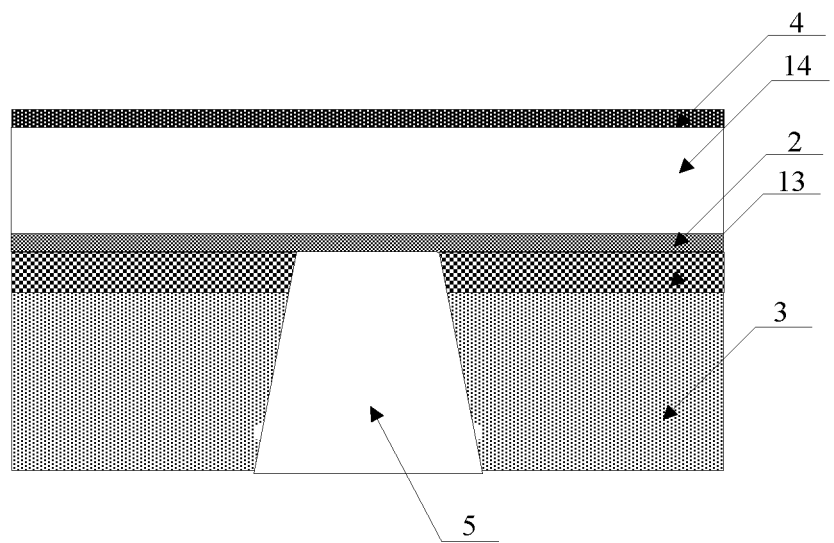
Figure 15:
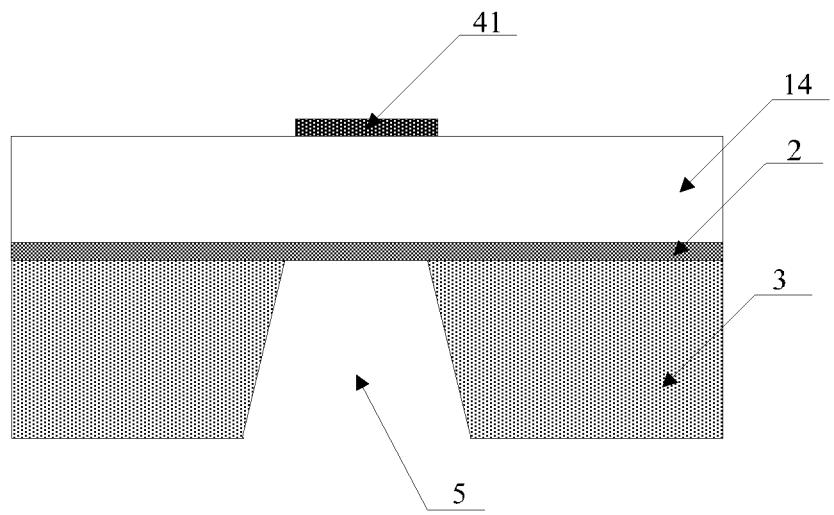
Figure 16:
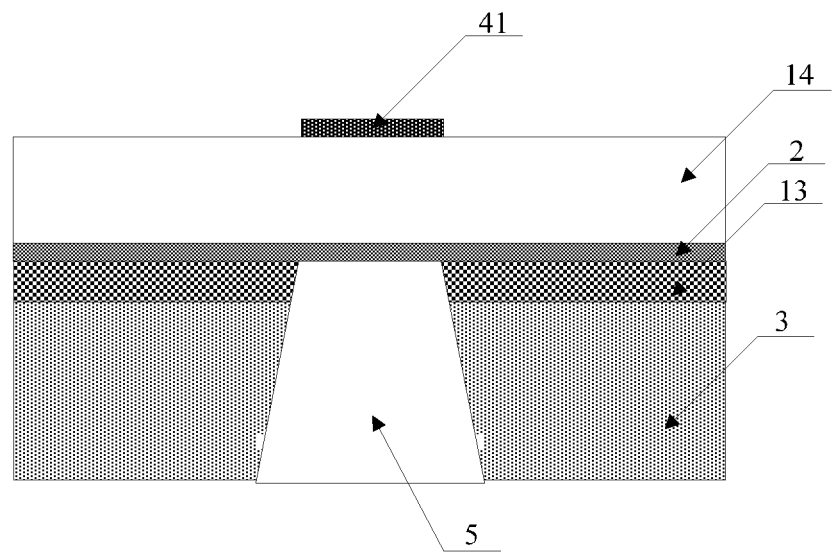

As an example, a specific method for forming the upper electrode 41 on the surface of the oxide monocrystal film 14 is: firstly, an upper electrode layer 4 is formed on the surface of the oxide monocrystal film 14, as shown in FIGS. 13 to 14. FIG. 13 is a structure obtained on the basis of the structure corresponding to FIG. 11, and FIG. 14 is a structure obtained on the basis of the structure corresponding to FIG. 12; and then, the upper electrode 41 is formed by photolithography and etching processes, as shown in FIGS. 15 to 16, FIG. 15 is a structure obtained on the basis of the structure corresponding to FIG. 13, and FIG. 16 is a structure obtained on the basis of the structure corresponding to FIG. 14.

As an example, the thickness of the upper electrode 41 may be set according to actual needs. Preferably, in the present embodiment, the thickness of the upper electrode 41 is 10 nm to 2 μm.

As an example, the upper electrode 41 may be of a single metal film structure or a stacked structure of different metal film layers. Preferably, in the present embodiment, the material of the upper electrode 41 may be, but is not limited to, copper, gold, titanium, platinum, molybdenum, ruthenium, chromium, aluminum or tin.

In conclusion, the present disclosure provides a method for preparing a film bulk acoustic wave device by using a film transfer technology, which at least includes the following steps: 1) providing an oxide monocrystal substrate, one surface of the oxide monocrystal substrate is an implantation surface; 2) implanting ions from the implantation surface into the oxide monocrystal substrate, and then forming a lower electrode on the implantation surface; or forming the lower electrode on the implantation surface, and then implanting ions from the implantation surface into the oxide monocrystal substrate, ion implantation energy is sufficient to implant ions into a preset depth in the oxide monocrystal substrate; and forming a defect layer at the preset depth; 3) providing a support substrate and bonding a structure obtained in step 2) with the support substrate, the surface of the lower electrode is a bonding surface; 4) removing part of the oxide monocrystal substrate along the defect layer so as to obtain an oxide monocrystal film, and transferring the obtained oxide monocrystal film and the lower electrode to the support substrate; 5) etching the support substrate from a bottom of the support substrate to form a cavity, the cavity exposes the lower electrode; and 6) forming an upper electrode on the surface of the oxide monocrystal film. The present disclosure provides a new method for preparing a core structure of film bulk acoustic wave filter of metal electrode-monocrystal oxide-metal electrode, which effectively solves the problem of prepare the monocrystal oxide between the metal electrodes. The oxide monocrystal film is formed by an ion peeling process, and the film and the substrate are integrated by bonding, so there is almost no requirement for lattice matching degree, and the selection of film materials and substrate materials is more flexible. The obtained film is actually a part of the peeled bulk material, so the crystal quality and performance of the film are theoretically equivalent to those of the bulk material. If a monocrystal bulk material is used for peeling, a monocrystal film material can be obtained. Different from a film material obtained by a traditional film growth technology, defects can be controlled within a very small thickness range near an interface by bonding, the internal lattice quality of the film is not affected, and even if the thickness of the peeled film is very small, the material performance can be ensured. Different types of high-quality films can be integrated on the same substrate at the same time, and the performance of each film material is not affected by the preparation process, thereby greatly improving the integration level of the device and the flexibility of design. By means of ion co-implantation, the total ion implantation dose required for peeling off and transferring the film can be effectively reduced, thereby shortening the preparation period and saving the production cost. At the same time, the method can also solve the problem that some materials cannot be removed by single ion implantation.

The above embodiments only exemplarily illustrate the principles and effects of the present disclosure, but are not used to limit the disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method for preparing a film bulk acoustic wave device by using a film transfer technology comprising at least the following steps:
   1) providing an oxide monocrystal substrate, wherein one surface of the oxide monocrystal substrate is an implantation surface;
   2) implanting ions from the implantation surface into the oxide monocrystal substrate, and then forming a lower electrode on the implantation surface, or forming a lower electrode on the implantation surface, and then implanting ions from the implantation surface into the oxide monocrystal substrate, wherein ion implantation energy is sufficient to implant the ions into a preset depth in the oxide monocrystal substrate; and forming a defect layer at the preset depth;
   3) providing a support substrate and bonding a structure obtained in step 2) with the support substrate, wherein the surface of the lower electrode is a bonding surface;
   4) removing part of the oxide monocrystal substrate along the defect layer so as to obtain an oxide monocrystal film, and transferring the obtained oxide monocrystal film and the lower electrode to the support substrate;
   5) etching the support substrate from a bottom of the support substrate to form a cavity, wherein the cavity exposes the lower electrode; and
   6) forming an upper electrode on the surface of the oxide monocrystal film.

2. The method for preparing a film bulk acoustic wave device by using a film transfer technology according to claim 1, wherein between the step 1) and the step 2) further comprising a step of cleaning said oxide monocrystal substrate.

3. The method for preparing a film bulk acoustic wave device by using a film transfer technology according to claim 1, wherein in step 2) the ions implanted in the oxide monocrystal substrate are H ion or He ions.

4. The method for preparing a film bulk acoustic wave device by using a film transfer technology according to claim 3, wherein the implantation dose of the H ions or He ions is $1 \times 10^{16}$ ions/cm$^2$ to $1 \times 10^{18}$ ions/cm$^2$.

5. The method for preparing a film bulk acoustic wave device by using a film transfer technology according to claim 3, wherein the implantation of the H ions performed prior to the implantation of the He ions.

6. The method for preparing a film bulk acoustic wave device by using a film transfer technology according to claim 3, wherein the H ions are injected after the implantation of the He ions.

7. The method for preparing a film bulk acoustic wave device by using a film transfer technology according to claim 3, wherein the H ions and the He ions are simultaneously injected.

8. The method for preparing a film bulk acoustic wave device by using a film transfer technology according to claim 3, wherein the implantation doses of the H ions and the He ions are both $1 \times 10^{16}$ ions/cm$^2$ to $1 \times 10^{18}$ ions/cm$^2$.

9. The method for preparing a film bulk acoustic wave device by using a film transfer technology according to claim 3, wherein in the step 2), the preset depth is from 10 nm to 50 μm.

10. The method for preparing a film bulk acoustic wave device by using a film transfer technology according to claim 1, wherein in step 3), the structure obtained by the step 2) is bonded to the support substrate by direct bonding, or indirect bonding including dielectric layer bonding, metal bonding, and anode bonding.

11. The method for preparing a film bulk acoustic wave device by using a film transfer technology according to claim 10, wherein a structure obtained by the step 3) is annealed to peel off part of the oxide monocrystal substrate along the defective layer.

12. The method for preparing a film bulk acoustic wave device by using a film transfer technology according to claim 11, wherein the annealing treatment is carried out in a vacuum environment or under a protective atmosphere formed by one of nitrogen and inert gas, wherein the annealing temperature is from 100° C. to 600° C., and the annealing time is from 1 minute to 48 hours.

13. The method for preparing a film bulk acoustic wave device by using a film transfer technology according to claim 1, wherein between the step 4) and the step 5), further comprising a step of surface planarization of the oxide monocrystal film.

\* \* \* \* \*